United States Patent
Cho et al.

(10) Patent No.: US 11,184,546 B2
(45) Date of Patent: Nov. 23, 2021

(54) ZOOMABLE IMAGE SENSOR AND IMAGE SENSING METHOD

(71) Applicant: SAMSUNG ELECTRONICS CO., LTD., Suwon-si (KR)

(72) Inventors: Yang Ho Cho, Seongnam-si (KR); Kyuhwan Choi, Yongin-si (KR); Seunghoon Han, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 16 days.

(21) Appl. No.: 16/775,965

(22) Filed: Jan. 29, 2020

(65) Prior Publication Data

US 2021/0112201 A1 Apr. 15, 2021

(30) Foreign Application Priority Data

Oct. 10, 2019 (KR) .................. 10-2019-0125238

(51) Int. Cl.
*H04N 5/225* (2006.01)
*H04N 5/232* (2006.01)

(52) U.S. Cl.
CPC ....... *H04N 5/23296* (2013.01); *H04N 5/2254* (2013.01); *H04N 5/23229* (2013.01)

(58) Field of Classification Search
None
See application file for complete search history.

(56) References Cited

U.S. PATENT DOCUMENTS

| 8,767,047 | B2 | 7/2014 | Molnar et al. |
| 9,485,397 | B2 * | 11/2016 | Rudmann ......... H01L 27/14623 |
| 10,018,804 | B2 | 7/2018 | Prabhakar et al. |
| 10,129,984 | B1 * | 11/2018 | Lamkin ................ H01L 25/167 |
| 2017/0034500 | A1 | 2/2017 | Arbabi et al. |
| 2020/0225386 | A1 * | 7/2020 | Tsai ...................... G02B 1/002 |

FOREIGN PATENT DOCUMENTS

| KR | 10-2016-0120653 A | | 10/2016 |
| KR | 10-2017-0015108 A | | 2/2017 |
| KR | 1020170015108 | * | 2/2017 |
| KR | 10-2017-0035237 A | | 3/2017 |
| KR | 10-2019-0022028 A | | 3/2019 |
| KR | 10-2019-0054815 A | | 5/2019 |

* cited by examiner

*Primary Examiner* — Gary C Vieaux
(74) *Attorney, Agent, or Firm* — Sughrue Mion, PLLC

(57) ABSTRACT

An image sensor includes a plurality of lens elements, each lens element of the plurality of lens elements including a plurality of scatterers arranged to concentrate light incident on the image sensor; and a sensing element configured to sense light passing through the plurality of lens elements, wherein one lens element of the plurality of lens elements has a first focal length that is different from a second focal length of another lens element of the plurality of lens elements and is separated from the sensing element by the first focal length.

16 Claims, 10 Drawing Sheets

ZOOMABLE IMAGE SENSOR AND IMAGE SENSING METHOD

CROSS-REFERENCE TO RELATED APPLICATION

This application claims priority from Korean Patent Application No. 10-2019-0125238 filed on Oct. 10, 2019, in the Korean Intellectual Property Office, the disclosure of which is incorporated herein by reference in its entirety.

BACKGROUND

1. Field

Methods and apparatuses consistent with example embodiments relate to an image sensor capable of zooming.

2. Description of Related Art

The development of optical technology and image processing technology has enabled a wider use of an image capturing device in a wider field of applications including multimedia content, security, and recognition, for example. For example, the imaging capturing device may be provided or embedded in a mobile device, a camera, a vehicle, and a computer to capture an image or obtain data to be used to recognize an object or control a device. A volume or size of the imaging capturing device may be based on factors such a size of a lens, a focal length of the lens, and a size of a sensor. For example, the volume of the imaging capturing device may be adjusted based on the size of the lens and the size of the sensor. As the size of the sensor decreases, the amount of light that may be incident on the sensor may be reduced. Thus, an image resolution may also be reduced, or it may not be easy to capture an image in a low-illumination environment. To reduce the volume of the image capturing device, a multi-lens including small lenses may be used.

SUMMARY

One or more example embodiments may address at least the above problems and/or disadvantages and other disadvantages not described above. Also, the example embodiments are not required to overcome the disadvantages described above, and an example embodiment may not overcome any of the problems described above.

According to an aspect of an example embodiment, there is provided an image sensor including: a plurality of lens elements, each lens element of the plurality of lens elements including a plurality of scatterers arranged to concentrate light incident on the image sensor; and a sensing element configured to sense light passing through the plurality of lens elements, wherein one lens element of the plurality of lens elements has a first focal length that is different from a second focal length of another lens element of the plurality of lens elements and is separated from the sensing element by the first focal length.

The image sensor may further include: a sensing array including a plurality of sensing elements, including the sensing element, arranged in a form of an array, the sensing array having a plurality of sensing regions each configured to sense light passing through a respective lens element of the plurality of lens elements; and a processor configured to restore a scene image corresponding to a target zoom factor based on sensing information sensed from at least one sensing region of the plurality of sensing regions.

Each lens element of the plurality of lens elements may have a respective focal length that is different from respective focal lengths of other lens elements of the plurality of lens elements, and the processor may be further configured to obtain a plurality of images, wherein each image of the plurality of images corresponds to a respective sensing region of the plurality of sensing regions, and each image of the plurality of images corresponds to a respective viewing angle that is different from respective viewing angles of other images of the plurality of images.

The processor may be further configured to, based on the target zoom factor being different from respective lens zoom factors of each lens element of the plurality of lens elements, restore the scene image corresponding to the target zoom factor from sensing information sensed from at least two sensing regions of the plurality of sensing regions.

The processor may be further configured to, based on the target zoom factor being between a first lens zoom factor corresponding to a first lens element of the plurality of lens elements and a second lens zoom factor corresponding to a second lens element of the plurality of lens elements, restore the scene image corresponding to the target zoom factor from sensing information sensed from a first sensing region covered by the first lens element and a second sensing region covered by the second lens element.

The processor may be further configured to, based on the target zoom factor corresponding to a lens zoom factor that corresponds to a lens element of the plurality of lens elements, restore the scene image corresponding to the target zoom factor from sensing information sensed from a sensing region covered by the lens element.

The processor may be further configured to, based on the target zoom factor being input by a user, generate the scene image corresponding to the target zoom factor by detecting a common region in a plurality of images obtained from respective sensing regions of the plurality of sensing regions and synthesizing the obtained plurality of images based on the detected common region.

Each scatterer of the plurality of scatterers may be configured to delay a phase of light incident on the scatterer and change a path of the light.

Each scatterer of the plurality of scatterers may be disposed such that a shape of the scatterer, an arrangement of the plurality of scatterers, and a gap between adjacent scatterers of the plurality of scatterers is based on a focal length of a lens element including the scatterer among the lens elements.

The image sensor may further include a transparent substrate disposed between the plurality of lens elements and the sensing element.

The transparent substrate may include a blocker configured to prevent light passing through a first lens element of the plurality of lens elements from being incident on a sensing region covered by a second lens element of the plurality of lens elements.

The blocker may be disposed in at least a portion of an outer boundary of the sensing region.

The transparent substrate may be configured to separate each lens element of the plurality of lens elements from the sensing element by a corresponding focal length of the lens element.

The plurality of scatterers may be disposed on one surface of the transparent substrate.

At least a portion of each scatterer of the plurality of scatterers may protrude outside the transparent substrate, and a remaining portion of each scatterer of the plurality of scatterers may be formed inside the transparent substrate.

At least a portion of each scatterer of the plurality of scatterers and a remaining portion of each scatterer of the plurality of scatterers may be disposed on opposite sides relative to a virtual surface parallel to a planar surface on which the sensing element is disposed.

The image sensor may further include a plurality of additional lens elements disposed separately from the plurality of lens elements, the plurality of additional lens elements being configured to concentrate light incident on the image sensor onto the plurality of lens elements.

According to an aspect of an example embodiment, there is provided a mobile terminal including the image sensor.

According to an aspect of an example embodiment, there is provided am image sensing method to be performed by an image sensor, the image sensing method including: concentrating light incident on the image sensor using a plurality of lens elements of the image sensor, each lens element of the plurality of lens elements including a plurality of scatterers; and sensing, by a sensing element of the image sensor, light passing through the plurality of lens elements, wherein one lens element of the plurality of lens elements has a first focal length that is different from a second focal length of another lens element of the plurality of lens elements and is separated from the sensing element by the first focal length.

BRIEF DESCRIPTION OF THE DRAWINGS

The above and/or other aspects will be more apparent by describing certain example embodiments, taken in conjunction with the accompanying drawings, in which.

DETAILED DESCRIPTION

Figure 1:
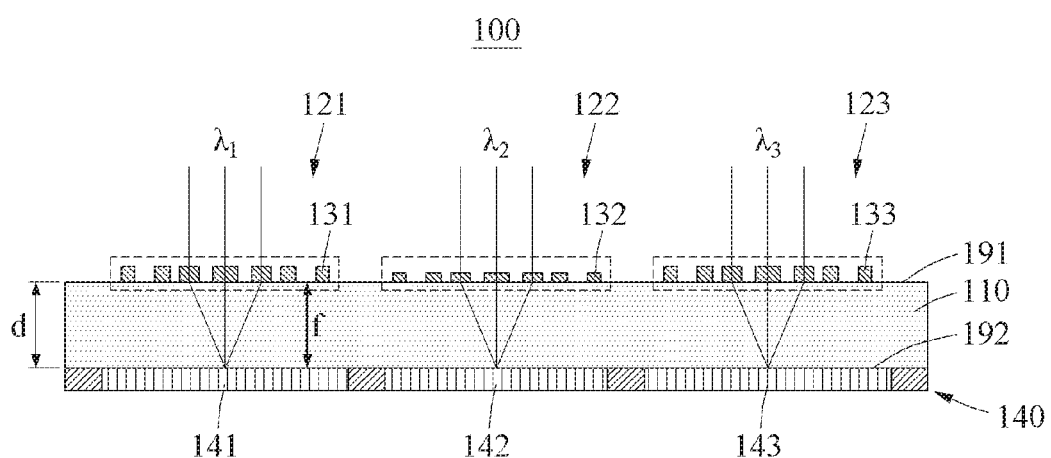
FIG. 1 is a cross-sectional view of an image sensor according to an example embodiment.

Reference will now be made in detail to example embodiments, examples of which are illustrated in the accompanying drawings, wherein like reference numerals refer to like elements throughout.

The following structural or functional descriptions are merely provided to describe the example embodiments, and the scope of the example embodiments is not limited to the descriptions provided in the disclosure. Various changes and modifications can be made thereto by those of ordinary skill in the art.

Although the terms "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the present disclosure.

It will be understood that when a component is referred to as being "connected to" another component, the component can be directly connected or coupled to the other component or intervening components may be present.

As used herein, the singular forms are intended to include the plural forms as well, unless the context clearly indicates otherwise. It should be further understood that the terms "comprises," "comprising," "includes," and/or "including," when used in this specification, specify the presence of stated features, integers, steps, operations, elements, components or a combination thereof, but do not preclude the presence or addition of one or more other features, integers, steps, operations, elements, components, and/or groups thereof. Expressions such as "at least one of" when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Unless otherwise defined herein, all terms used herein including technical or scientific terms have the same meanings as those generally understood by one of ordinary skill in the art. Terms defined in dictionaries generally used should be construed to have meanings matching with contextual meanings in the related art and are not to be construed as an ideal or excessively formal meaning unless otherwise defined herein.

FIG. 1 is a cross-sectional view of an image sensor according to an example embodiment.

Referring to FIG. 1, an image sensor 100 includes a substrate 110, a plurality of thin lens elements, for example, a first thin lens element 121, a second thin lens element 122, and a third thin lens element 123 as illustrated, and a sensing array 140.

The substrate 110 may be provided in a form of a plate. A first surface 191 and a second surface 192 of the substrate 110 may be substantially parallel to each other. However, the first surface 191 and the second surface 192 may not be necessarily completely parallel to each other, but formed obliquely to each other. The substrate 110 and the sensing array 140 may be disposed separately from each other with an air layer therebetween. The substrate 110 may include a transparent material. The transparent material refers to a material having a relatively high light transmittance. The substrate 110 may include at least one type of polymer such as, for example, silicon nitride ($Si_3N_4$), silicon dioxide ($SiO_2$), polymethyl methacrylate (PMMA), and polydimethylsiloxane (PDMS). For example, the thin lens elements 121, 122, and 123 may change a path of travel of incident light before it passes through the substrate 110 to be incident on the sensing array 140.

The thin lens elements 121, 122, and 123 are disposed on the first surface 191 of the substrate 110. Each of the thin lens elements 121, 122, and 123 is designed to concentrate light of a preset wavelength band onto the sensing array 140. As shown in FIG. 1, the thin lens elements 121, 122, and 123 include scatterers 131, 132, and 133, respectively. For example, the thin lens elements 121, 122, and 123 may be embodied by optical elements configured to change a path of light by a difference in phase delay caused by the scatterers 131, 132, and 133 included in the thin lens elements 121, 122, and 123. A lens designed using such phase difference of light may be referred to as a metalens. Thus, a thin lens element described herein may be designed thinly with relatively less restriction on thickness compared to an optical lens. The scatterers 131, 132, and 133 disposed on respective surfaces of the thin lens elements 121, 122, and 123 are configured to allow light incident on the scatterers 131, 132, 133 to resonate. Each of the scatterers 131, 132, and 133 is designed to delay a transmission phase of light incident thereon.

The scatterers 131, 132, and 133 each configured to delay a transmission phase of light are arranged on the first surface 191 of the substrate 110. The scatterers 131, 132, and 133 may be arranged such that a wavefront of light transmitted through the first surface 191 of the substrate 110 is formed at a target point on the sensing array 140. The thin lens elements 121, 122, and 123 may thus change a traveling direction of transmitted light with respect to incident light by modulating the wavefront of the light.

For example, the first thin lens element 121 concentrates light of a first wavelength band (e.g., a band including $\lambda_1$ wavelength) of incident light. The second thin lens element 122 concentrates light of a second wavelength band (e.g., a band including $\lambda_2$ wavelength) of incident light. The third thin lens element 123 concentrates light of a third wavelength band (e.g., a band including $\lambda_3$ wavelength) of incident light. However, examples are not limited thereto. For another example, all the thin lens elements 121, 122, and 123 may not necessarily concentrate light of different wavelength bands, and two of the three thin lens elements 121, 122, and 123 may concentrate light of a same wavelength band or all three thin lens elements 121, 122, and 123 may concentrate light of a same wavelength band.

The sensing array 140 is disposed on the second surface 192 that faces the first surface 191. The sensing array 140 includes a plurality of sensing elements, for example, a first sensing element 141, a second sensing element 142, and a third sensing element 143 as illustrated. Each of the sensing elements 141, 142, and 143 is configured to generate a signal indicating an intensity of incident light in response to the light being incident on a corresponding sensing element. Although to be described hereinafter with reference to FIG. 5, the sensing array 140 may be classified into a plurality of sensing regions respectively covered by the thin lens elements 121, 122, and 123. For example, the sensing array 140 includes a first sensing region covered by the first thin lens element 121, a second sensing region covered by the second thin lens element 122, and a third sensing region covered by the third thin lens element 123. In this example, the first sensing region includes the first sensing element 141, the second sensing region includes the second sensing element 142, and the third sensing region includes the third sensing element 143. The sensing elements 141, 142, and 143 are illustrated in FIG. 1 as being arranged adjacent to each other. However, examples are not limited thereto, and the sensing elements 141, 142, and 143 may be arranged separately from each other.

The sensing elements 141, 142, and 143 may be disposed to respectively correspond to the thin lens elements 121, 122, and 123. For example, the first sensing element 141 is configured to detect light passing through the first thin lens element 121. The second sensing element 142 is configured to detect light passing through the second thin lens element 122. The third sensing element 143 is configured to detect light passing through the third thin lens element 123. As described, each of the sensing elements 141, 142, and 143 is configured to receive light. A processor of the image sensor 100 may generate images, for example, first through third images, based on sensing information obtained respectively from the sensing elements 141, 142, and 143.

Each of the sensing elements 141, 142, and 143 may include, for example, a device or component configured to convert an optical signal to an electrical signal. For example, each of the sensing elements 141, 142, and 143 may include a charge-coupled device (CCD) and a complementary metal-oxide semiconductor (CMOS). For another example, each of the sensing elements 141, 142, and 143 may include a photodiode configured to convert light energy to electrical energy.

Figure 2:
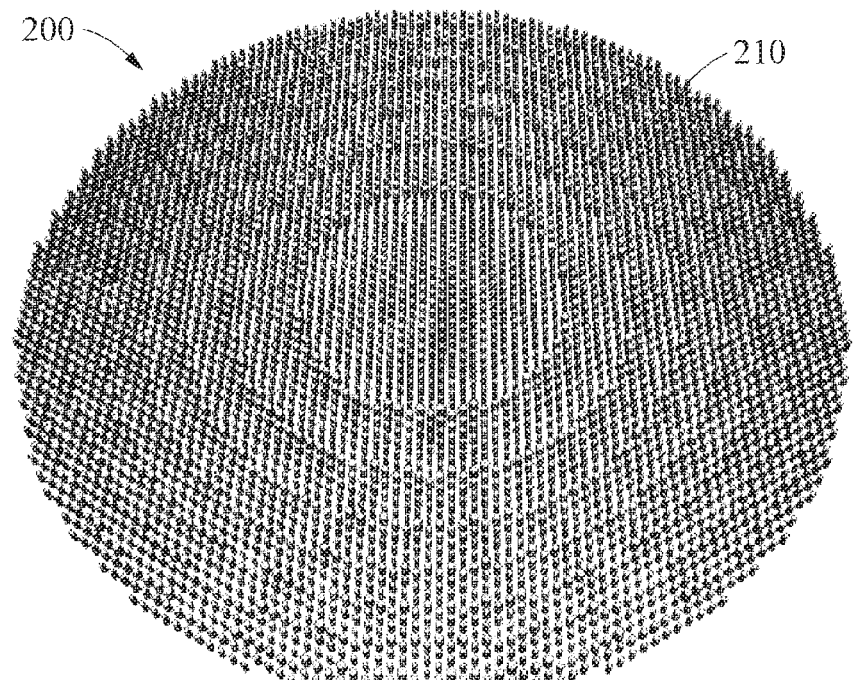
FIGS. 2 and 3 illustrate a thin lens element included in an image sensor according to an example embodiment.
Figure 3:
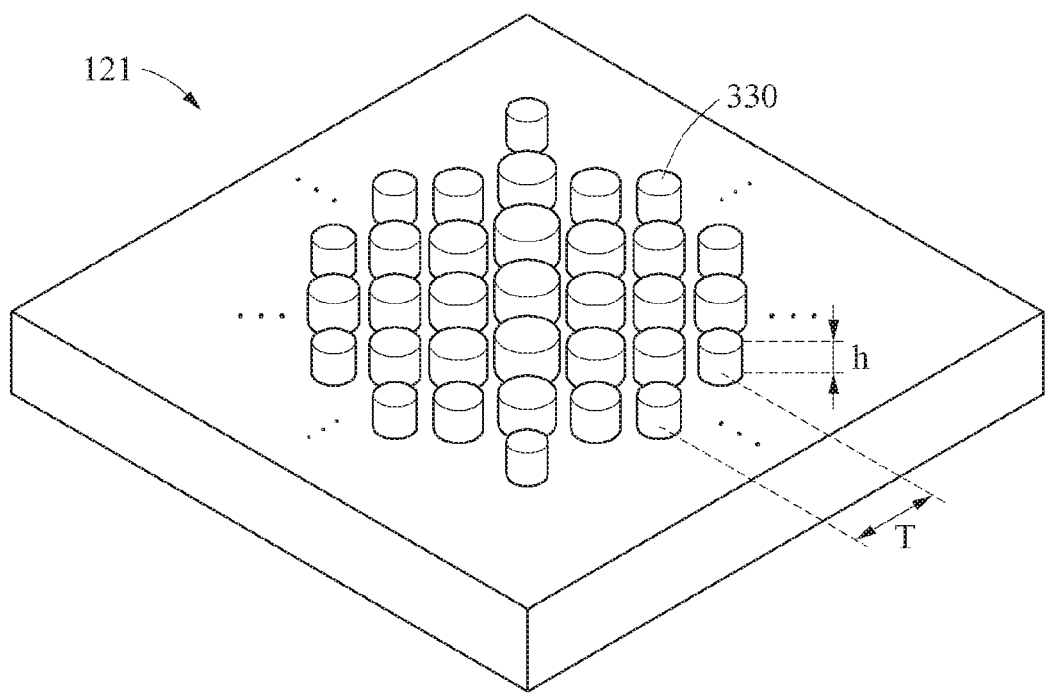

FIGS. 2 and 3 illustrate a thin lens element included in an image sensor according to an example embodiment.

FIG. 2 illustrates a lens element 200 which may be one of the thin lens elements 121, 122, and 123 of FIG. 1.

Referring to FIG. 2, a plurality of scatterers 210 is arranged along a surface to form the thin lens element 200. Based on a shape of each of the scatterers 210, a gap between the scatterers 210 in the arrangement, and a shape of the arrangement of the scatterers 210, a waveform of light passing through the thin lens element 200 may be adjusted. For example, light passing through the thin lens element 200 including the scatterers 210 arranged and formed as illustrated in FIG. 2 may be concentrated. That is, the thin lens element 200 may perform a function as a lens having positive refractive power, for example.

FIG. 3 illustrates the first thin lens element 121 of FIG. 1. The first thin lens element 121 will be described hereinafter as an example with reference to FIG. 3, and the following description may be applicable to other thin lens elements, for example, the second thin lens element 122 and the third thin lens element 123.

Referring to FIG. 3, a plurality of pillar-shaped scatterers 330 is arranged on a surface. Although each of the scatterers 330 is illustrated as having a cylindrical shape, examples are not limited to the illustrated shape. For example, the scatterers 330 may be provided in various shapes, for example, a polyhedral pillar, a cylinder, and an elliptic cylinder. The scatterers 330 may also be of a pillar shape of which a cross section parallel to the surface of a substrate is of an L shape. Although the surface on which the scatterers 330 are disposed is described as one surface of the substrate, the surface is not limited thereto. For example, the scatterers 330 may be disposed separately from a sensing element by a support member.

A material included in the scatterers 330 may have a refractive index which is greater than that of a material included in the substrate. That is, the substrate may include a material with a first refractive index, and the scatterers 330 may include a material with a second refractive index. For example, the scatterers 330 may include at least one of crystalline silicon (c-Si), polycrystalline silicon (poly-Si), amorphous silicon (a-Si), $Si_3N_4$, GaP, $TiO_2$, AlSb, AlAs, AlGaAs, AlGaInP, BP, and $ZnGeP_2$. The substrate may include a polymer such as, for example, PMMA and PDMS, $Si_3N_4$, and $SiO_2$. In addition, on the substrate including such material with a relatively lower refractive index, an additional clad layer with a relatively higher refractive index that surrounds and covers the scatterers 330 may be formed.

However, the scatterers 330 may not be necessarily formed on one surface of the substrate, and the substrate may not be necessarily formed of the material with the first refractive index. For example, the scatterers 330 may be supported by the support member without the substrate and arranged separately from the sensing element. Alternatively, the substrate may be hollow inside and include an air layer therein, or the substrate may be disposed separately from the sensing element and an air layer may be present between the substrate and the sensing element. As described, between the scatterers 330 and the sensing element, there may be at least an air layer. The second refractive index may be greater than a refractive index of such air layer.

A shape or pattern of an arrangement of the scatterers 330 may vary based on a wavelength band of light to be concentrated by the first thin lens element 121. For example, as shown in FIG. 3, a gap T between the scatterers 330 included in the first thin lens element 121 and a direction of the arrangement of the scatterers 330 may be determined based on a first wavelength $\lambda_1$ to be concentrated by the first thin lens element 121. The gap T between the scatterers 330 of the first thin lens element 121 may be less than the first wavelength $\lambda_1$. For example, the gap T between the scatterers 330 of the first thin lens element 121 may be ¾ or less or ⅔ or less of the first wavelength $\lambda_1$. In addition, a height h of the scatterers 330 of the first thin lens element 121 may also be less than the first wavelength $\lambda_1$. For example, as shown in FIG. 3, the height h of the scatterers 330 of the first thin lens element 121 may be ⅔ or less of the first wavelength $\lambda_1$.

According to an example embodiment, a plurality of scatterers included in each of the thin lens elements may have a pillar shape. The pillar shape may have a cross section which is one of a round shape, an elliptic shape, a rectangular shape, and a square shape. The pillar shape may be inclined in a height direction. However, a shape of the scatters is not limited thereto. For example, the scatterers may be provided in a polyhedral pillar shape or in a pillar shape having an L-shaped cross section. Alternatively, the scatterers may be formed in a multilayer structure of materials having different refractive indices in the height direction. In such a case, a shape of the scatterers may not have symmetry in a certain direction. For example, a cross section of the scatterers may be of a shape such as an ellipse with no horizontal symmetry. In addition, the cross section of the scatterers may vary in a height, and thus the shape of the scatterers may not have symmetry with respect to the height.

Based on the shape of the scatterers, wavelength selectivity of thin lens elements may vary. The wavelength selectivity may indicate a characteristic of each of the thin lens elements that selectively concentrates light of a preset wavelength band onto a sensing array including sensing elements. For example, the scatterers 330 included in the first thin lens element 121 may be of a shape suitable to concentrate light of a first wavelength band including a first wavelength $\lambda_1$. For example, a shape of a cross section of the scatterers 330, a ratio between a width and a height of the scatterers 330, and the like may vary. In addition, scatterers included in the second thin lens element 122 may be of a shape suitable to concentrate light of a second wavelength band including a second wavelength $\lambda_2$. In addition, scatterers included in the third thin lens element 123 may be of a shape suitable to concentrate light of a third wavelength band including a third wavelength $\lambda_3$.

Although the wavelength selectivity of a thin lens element may vary based on a shape of scatterers as described above, examples are not limited thereto. For example, the wavelength selectivity of the thin lens element may vary based on a height of the scatterers and a gap therebetween. In addition, a focal length of the thin lens element may vary by the shape and the height of the scatterers and the gap therebetween, for example. The shape and the height of the scatterers and the gap therebetween may be determined by a general metalens designing methodology.

The shape of the scatterers 330 of the first thin lens element 121 has been mainly described above with reference to FIG. 3. The above description may also be applicable to the second thin lens element 122 and the third thin lens element 123. However, a detailed shape of scatterers, a gap between the scatterers in an arrangement, and a direction of the arrangement of the scatterers may vary based on wavelength selectivity and a focal length of each of the other thin lens elements 122 and 123. For example, a height of scatterers included in the second thin lens element 122 and a gap therebetween may be determined based on a second wavelength $\lambda_2$. In this example, the height and the gap of the scatterers included in the second thin lens element 122 may be less than the second wavelength $\lambda_2$. For another example, a height of scatterers included in the third thin lens element 123 and a gap therebetween may be determined based on a third wavelength $\lambda_3$. In this example, the height and the gap of the scatterers included in the third thin lens element 123 may be less than the third wavelength $\lambda_3$.

A thin lens element may be also referred to as a metalens element and will be referred to hereinafter as a lens element.

Figure 4:
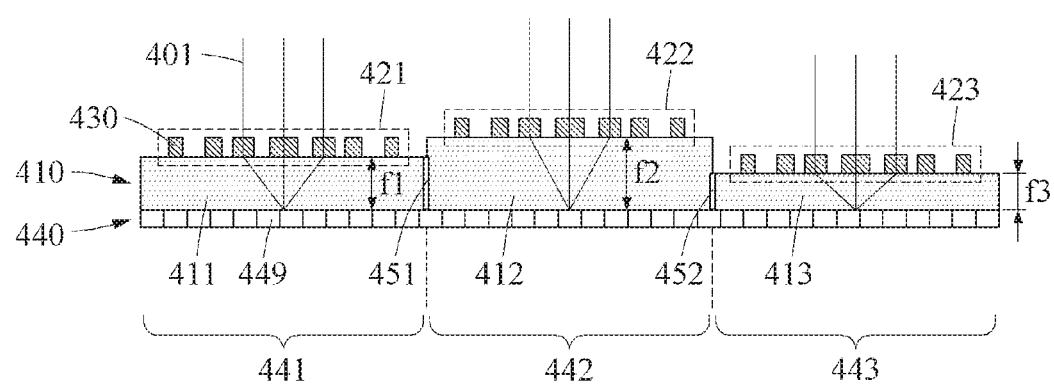
FIG. 4 is a cross-sectional view of thin lens elements having different focal lengths according to an example embodiment.

FIG. 4 is a cross-sectional view of thin lens elements having different focal lengths according to an example embodiment.

Referring to FIG. 4, an image sensor includes a plurality of lens elements, for example, a first lens element 421, a second lens element 422, and a third lens element 423, and a sensing element 449. A substrate 410 is disposed between the plurality of the lens elements 421, 422, and 423 and the sensing element 449.

The lens elements 421, 422, and 423 include a plurality of scatterers 430 configured to concentrate light incident on the image sensor. Each of the scatterers 430 may change a path of light by delaying a phase of light incident on the scatterer. The scatterers 430 are disposed in a shape, an arrangement, and a gap corresponding to a focal length of a corresponding lens element including corresponding scatterers. In other words, the shape of the scatterers, the arrangement of the scatterers on the substrate, and the size of the gap between adjacent scatterers may correspond to the focal length of the corresponding lens element. See, for example, FIGS. 1, 2, and 3.

The sensing element 449 may sense light passing through the lens elements 421, 422, and 423. The sensing element 449 is disposed on a planar surface of a sensing array 440. A sensing region in which the sensing element 449 is included may be classified by a lens element that covers the sensing element 449. In other words, as shown in FIG. 4, first sensing region 441 may correspond to the first lens element 421, second sensing region 442 may correspond to the second lens element 422, and the third sensing region may correspond to the third lens element 423.

Here, one of the lens elements 421, 422, and 423 may have a focal length different from that of another one of the lens elements 421, 422, and 423. The one lens element may be disposed separately from the sensing element 449 by the different focal length. As illustrated in FIG. 4, the first lens element 421, the second lens element 422, and the third lens element 423 include the plurality of scatterers 430. In other words, each of the lens elements 421, 422, and 423 may be separated from the sensing element 449 by a distance equal to its respective focal length.

For example, the first lens element 421 is configured to have a first focal length f1. The first lens element 421 is disposed separately from the sensing array 440 by the first focal length f1. A first portion 411 of the substrate 410 that corresponds to the first sensing region 441 has a height equal to the first focal length f1. Similarly, the second lens element 422 is configured to have a second focal length f2. The second lens element 422 is disposed separately from the sensing array 440 by the second focal length f2. A second portion 412 of the substrate 410 that corresponds to the second sensing region 442 has a height equal to the second focal length f2. In addition, the third lens element 423 is configured to have a third focal length f3. The third lens element 423 is disposed separately from the sensing array 440 by the third focal length f3. A third portion 413 of the substrate 410 that corresponds to the third sensing region 443 has a height equal to the third focal length f3. As illustrated, light 401 is concentrated on the sensing array 440 by the lens elements 421, 422, and 423. When the respective focal lengths f1, f2, and f3 of the lens elements 421, 422, and 423 are different from one another, respective viewing angles of the lens elements 421, 422, and 423 may also be different from one another. A viewing angle may indicate a range in which a lens may capture an image. For example, a telescopic camera may have a relatively long focal length, and thus may capture an image of an object present in a long distance at a relatively narrow viewing angle. In contrast, a pantoscopic camera may have a relatively short focal length, and thus may capture an image at a relatively broad viewing angle.

The substrate 410 may be formed of a transparent material, and may also be referred to as a transparent substrate 410. The transparent substrate 410 may separate each of the lens elements 421, 422, and 423 from the sensing array 440 by a corresponding focal length of each of the lens elements 421, 422, and 423.

The transparent substrate 410 further includes a blocker, for example, a first blocker 451 and a second blocker 452 as illustrated in FIG. 4. The blocker is configured to prevent light that has passed through one of the lens elements 421, 422, and 423 from being incident on a sensing region covered by another one of the lens elements 421, 422, and 423. The blocker may be disposed in at least a portion of an outer boundary of a corresponding sensing region. The blocker may also be disposed in a portion in which a corresponding sensing region is in contact with another sensing region. For example, the first blocker 451 is configured to prevent light passing through the first lens element 421 from proceeding toward the second sensing region 442. In addition, the first blocker 451 is configured to prevent light passing through the second lens element 422 from proceeding toward the first sensing region 441. Similarly, the second blocker 451 is configured to prevent light passing through the second lens element 422 from proceeding toward the third sensing region 443. In addition, the second blocker 452 is configured to prevent light passing through the third lens element 423 from proceeding toward the second sensing region 442. Thus, the blocker may prevent information that is not desired for each sensing region from being sensed. Although the blocker, for example, the blockers 451 and 452, is illustrated in FIG. 4 as being in a structure in which lens elements are arranged in a line, the blocker may be formed to surround a corresponding sensing region when it is arranged in another planar structure.

A plurality of sensing regions of the sensing array 440 may sense image information having a focus that is formed according to a viewing angle of each of lens elements having different viewing angles.

Figure 5:
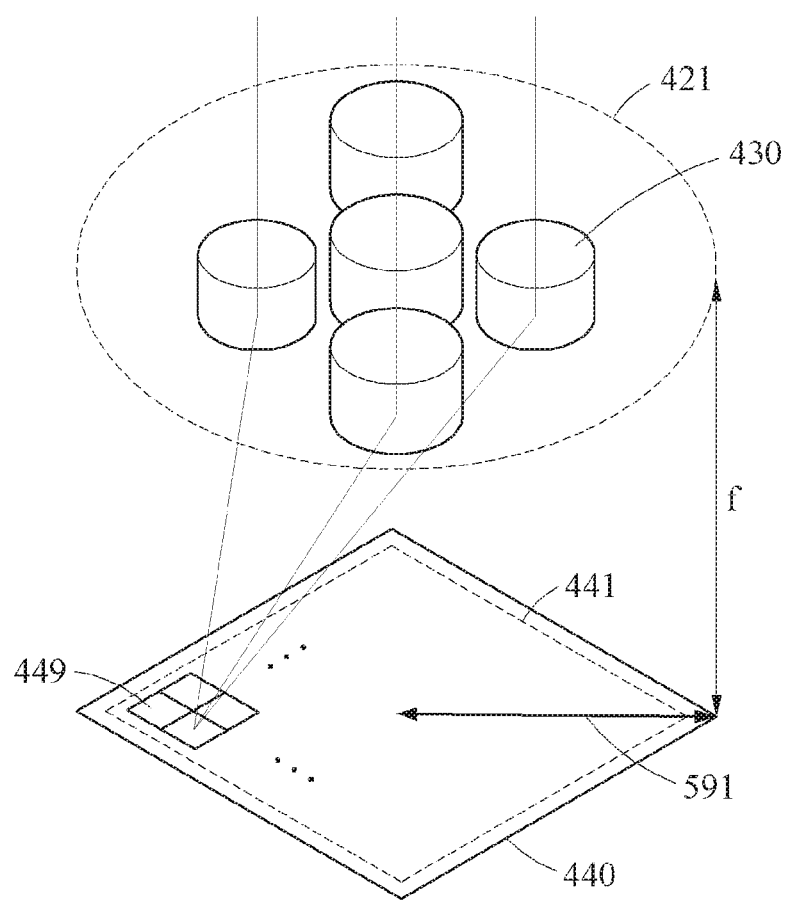
FIG. 5 illustrates a sensing region covered by a lens element according to an example embodiment.

FIG. 5 illustrates a sensing region covered by a lens element according to an example embodiment.

Referring to FIG. 5, an image sensor includes a sensing array 440 and a lens element 421 disposed separately (i.e., separated) from the sensing array 440 by a focal length of the lens element 421. The lens array 421 includes a plurality of scatterers 430, and the sensing array 440 includes a plurality of sensing elements 449.

The lens element 421 may cover a sensing region 441 of the sensing array 440 that corresponds to a lens size of the lens element 421. According to an example embodiment, the lens size may refer to a size of a region in which the scatterers 430 are arranged, for example, a size corresponding to a diameter of the region when the region is round.

The sensing region 441 may be a region on the sensing array 440 at which rays in a certain viewing angle range arrive after passing through the lens element 421. The sensing region 441 of the sensing array 440 that is covered by the lens element 421 may be determined based on the lens size of the lens element 421. For example, as illustrated, a size of the sensing region 441 is indicated by a distance 591 from a center of the sensing region 441 to an outermost point of the sensing region 441. That is, light passing through the lens element 421 may be incident on the sensing elements 449 included in the sensing region 441. The light may include a plurality of rays each corresponding to a flow or path of a photon.

For example, the lens element 421, which is one of a plurality of lens elements, may be eccentrically disposed with respect to at least one of the sensing elements 449. For example, the lens element 421 may not cover an integer number of sensing elements, but instead may cover a non-integer number of sensing elements. In this example, the lens element 421 may cover P/L sensing elements. In this example, P/L indicates a ratio between the number L of the lens elements and the number P of the sensing elements, in which L and P may be relatively prime to each other. In addition, P/L may be determined to be a real number. For example, as illustrated in the cross-sectional view of the image sensor in FIG. 4, on one axis, the number of lens elements is 3 (L=3) and the number of sensing elements is 37 (P=37), and the lens element 421 may therefore cover 37/3 sensing elements.

As described above, the image sensor may have an arrangement in which optical center axes (OCA) of lens elements may be slightly different with respect to the sensing array 440. In other words, each lens element may have a different alignment with the sensing elements of the sensing array. Thus, the lens elements may receive different sets of optical information. Since a direction of a chief ray of each lens element may vary, the image sensor may obtain more various sets of optical sensing information. Thus, the image sensor may restore a high-resolution image through the obtained various sets of sensing information.

Figure 6:
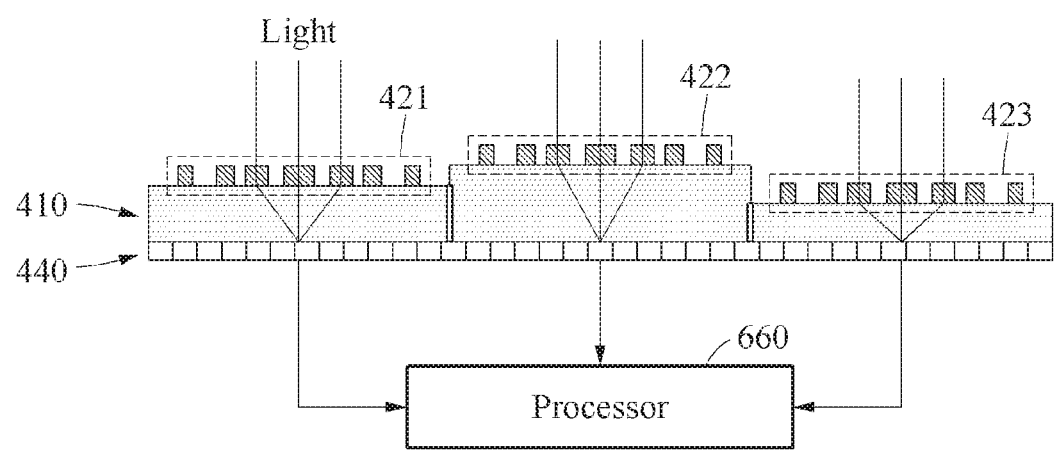
FIGS. 6 and 7 illustrate how an image sensor generates an image of a target zoom factor according to an example embodiment.
Figure 7:
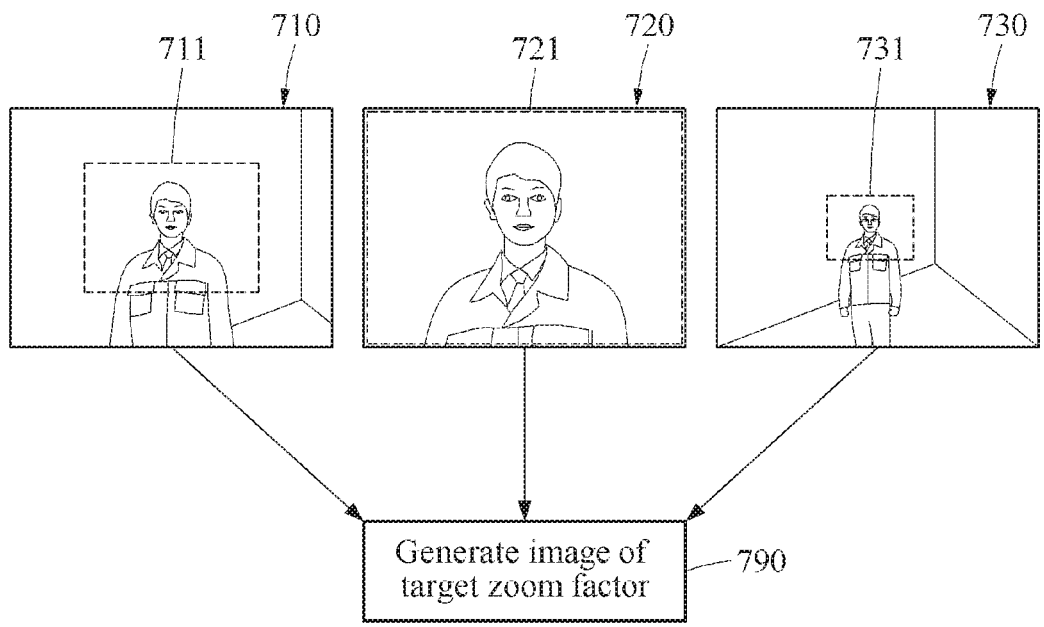

FIGS. 6 and 7 illustrate how an image sensor generates an image of a target zoom factor according to an example embodiment.

As described above with respect to FIG. 5, the sensing array 440 includes a plurality of sensing elements arranged in a form of an array. The sensing array 440 includes a plurality of sensing regions configured to sense light passing through the lens elements 421, 422, and 423, respectively.

According to an example, an image sensor further includes a processor 660 to restore a scene image corresponding to a target zoom factor based on sensing information obtained from the sensing regions. For example, the processor 660 may restore the scene image corresponding to the target zoom factor based on sensing information obtained from at least one of the sensing regions. The target zoom factor may refer to a zoom factor corresponding to a scene to be provided to a user, and may be input by the user or set as a default value, for example, a zoom factor of 1.

The lens elements 421, 422, and 423 may have different focal lengths. Since a viewing angle of a lens element is determined based on a focal length, the processor 660 may obtain images of different viewing angles from the sensing regions. For example, information corresponding to a first viewing angle may be sensed from a first sensing region corresponding to the first lens element 421. Similarly, information corresponding to a second viewing angle may be sensed from a second sensing region corresponding to the second lens element 422. In addition, information corresponding to a third viewing angle may be sensed from a third sensing region corresponding to the third lens element 423. The first viewing angle, the second viewing angle, and the third viewing angle may differ from one another.

Referring to FIG. 7, in operation 790, the processor 660 generates an image of a target zoom factor. Even when a user changes the target zoom factor, the processor 660 may generate a scene image of a viewing angle corresponding to each changing target zoom factor. The processor 660 may obtain sets of sensing information respectively corresponding to viewing angles through the sensing elements of the sensing array 440, and generate a new synthesized image corresponding to a target viewing angle using the obtained sensing information.

For example, when the target zoom factor is different from lens zoom factors respectively indicated by a plurality of lens elements, the processor 660 may restore the scene image corresponding to the target zoom factor from sensing information obtained from at least two of the sensing regions. When the target zoom factor is between lens zoom factors respectively corresponding to two of the lens elements, the processor 660 may restore the scene image corresponding to the target zoom factor from sensing information obtained from sensing regions covered by the two lens elements. For example, when the third lens element 423 corresponds to a zoom factor of 1, the first lens element 421 corresponds to a zoom factor of 2, and the second lens element 422 corresponds to a zoom factor of 4, and the target zoom factor is a zoom factor of 1.5, the processor 660 may generate a scene image corresponding to the zoom factor of 1.5 using first sensing information obtained from the first sensing region and third sensing information obtained from the third sensing region because the target zoom factor lies between the zoom factors of the first lens element 421 and the third lens element 423.

The processor 660 may detect a common region from image information corresponding to different viewing angles through image matching. The processor 660 may restore the scene image of a viewing angle corresponding to the target zoom factor by warping the common region detected from each set of the image information corresponding to the different viewing angles to match the image of the viewing angle to be generated. For example, when the target zoom factor is received as an input by the user, the processor 660 may generate the scene image corresponding to the target zoom factor by detecting the common region from images obtained respectively from the sensing regions and synthesizing the obtained images based on the detected common region. For example, as illustrated in FIG. 7, the processor 660 extracts, from first sensing information 710, a common region 711 which is shared with a viewing angle region 721 of second sensing information 720. In addition, the processor 660 extracts, from third sensing information 730, a common region 731 which is shared with the viewing angle region 721 of the second sensing information 720. The processor 660 generates the scene image corresponding to the target zoom factor based on the common regions 711, 721, and 731. Thus, the image sensor may generate a scene image of an improved image quality, compared to when using information received through a single lens element.

A substrate height between an individual lens element and a sensing array may be fixed or set, and thus the individual lens element may provide a limited viewing angle. However, the image sensor described herein may synthesize information of various viewing angles obtained by a plurality of lens elements and thus generate a scene image with more various viewing angles.

However, examples are not limited to the illustrated example. For example, when the target zoom factor is equal to a lens zoom factor of one of the plurality of lens elements, the processor 660 may generate the scene image corresponding to the target zoom factor from sensing information obtained from a sensing region covered by the one lens element. Thus, the image sensor may more rapidly generate a scene image corresponding to a lens zoom factor supported by each of the lens elements without additional image processing.

Figure 8:
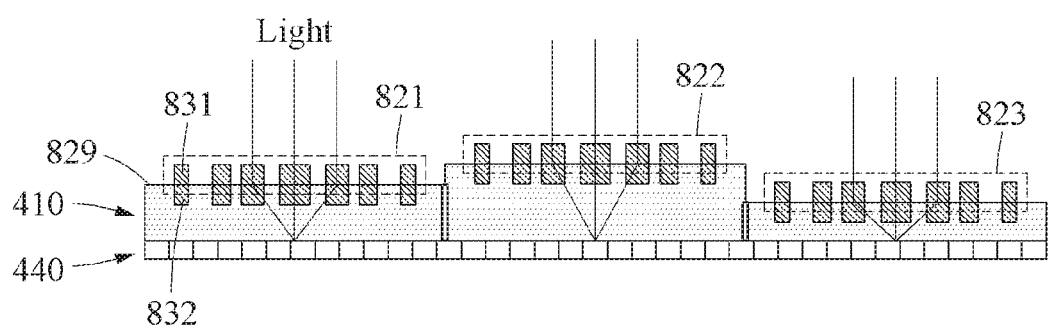
FIG. 8 illustrates an arrangement of scatterers on both sides according to an example embodiment.

FIG. 8 illustrates an arrangement of scatterers on both sides of a surface according to an example embodiment.

Referring to FIG. 8, a plurality of lens elements 821, 822, and 823 includes a plurality of scatterers 831 and 832. The scatterers 831 and 832 included in the lens elements 821, 822, and 823 are disposed on one surface of a transparent substrate 410.

In addition, at least a portion of the scatterers 831 and 832, for example, the scatterers 831, protrudes outside the transparent substrate 410. A remaining portion of the scatterers 831 and 832, for example, the scatterers 832, is formed inside the transparent substrate 410. In other words, each scatterer may include a portion that protrudes from the transparent substrate 410 and may include a remaining portion that is embedded in the transparent substrate 410. However, arrangements of the scatterers 831 and 832 are not limited to being inside or outside the transparent substrate 410. For example, the at least one portion (the scatterers 831) and the remaining portion (the scatterers 832) of the scatterers 831 and 832 may be disposed on opposite sides from each other relative to a virtual surface 829 parallel to a planar surface on which a sensing element is disposed. Thus, the scatterers 831 and 832 may be arranged on both sides based on a certain surface. As described above, the arrangements of the scatterers 831 and 832 may vary based on wavelength selectivity and focal lengths of the lens elements 821, 822, and 823.

Figure 9:
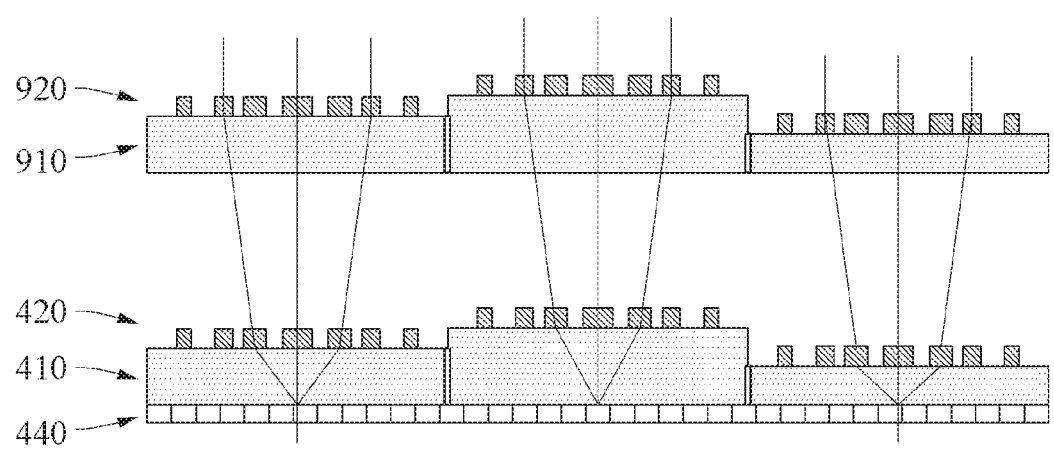
FIG. 9 illustrates an arrangement of lens elements in a plurality of layers according to an example embodiment.

FIG. 9 illustrates an arrangement of lens elements in a plurality of layers according to an example embodiment.

According to an example embodiment, an image sensor may further include a plurality of additional lens elements 920 as illustrated in FIG. 9. The additional lens elements 920 may be disposed separately from a plurality of lens elements 420, and may be configured to concentrate incident light onto the lens elements 420. FIG. 9 also illustrates an additional substrate 910 disposed separately from the lens elements 420 by a preset height. The additional substrate 910 may separate the additional lens elements 920 from the lens elements 420. However, examples are not limited to the illustrated example. For example, the additional substrate 910 may be formed adjacent to the lens elements 420. Alternatively, only the additional lens elements 920 may be disposed without the additional substrate 910. The lens elements 420 may be supplemented by the additional lens elements 920 for refractive power.

For example, a lens element and an additional lens element that cover a same sensing region of a sensing array 440 may have the same wavelength selectivity. In addition, a focus of the combined lens element and additional lens element may be on the sensing array 440.

Figure 10:
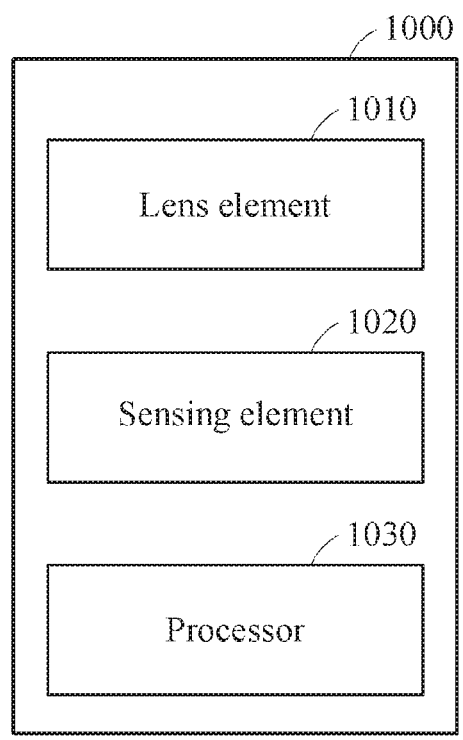
FIG. 10 is a block diagram illustrating an image sensor according to an example embodiment.

FIG. 10 is a block diagram illustrating an image sensor according to an example embodiment.

Referring to FIG. 10, an image sensor 1000 includes a lens element 1010, a sensing element 1020, and a processor 1030.

The lens element 1010 may be provided as a plurality of lens elements, and includes a plurality of scatterers. The lens element 1010 is configured to concentrate, onto a sensing array, light incident on the image sensor 1000. The lens element 1010 which may be one of the plurality of lens elements may have a focal length different from that of another one of the plurality of lens elements, and may be disposed separately from the sensing element 1020 by the different focal length. A structure of scatterers of a metalens may be designed such that an image is formed clearly at a focal length of each sensing array.

The sensing element 1020 is configured to sense light passing through the plurality of lens elements. The sensing element 1020 which may be provided as a plurality of sensing elements may be disposed along the sensing array. In other words, the sensing array may include the sensing elements.

The processor 1030 is configured to generate an image of a target zoom factor based on information sensed by the sensing element 1020 by which light passing through the lens element 1010 is received. For example, the processor 1030 may obtain image information of various viewing angles through sensing regions covered by the plurality of lens elements, and restore a scene image having a viewing angle corresponding to a desired zoom factor, or the target zoom factor, from the obtained image information. Thus, the image sensor 1000 may generate a consecutively zoomable image by obtaining images with different viewing angles through a multiarray metalens having different focal lengths and synthesizing the obtained images.

For more detailed descriptions of operations and structures of the lens element 1010, the sensing element 1020, and the processor 1030, reference may be made to what has been described above with reference to FIGS. 1 through 9.

The image sensor 1000 may be implemented by a mobile terminal. For example, the image sensor 1000 may be provided as a front camera and/or a rear camera of a smartphone. However, examples of the implementation are not limited thereto. For example, the image sensor 1000 may be embodied by a digital single-lens reflex (DSLR) camera, a vision camera for recognition in a vehicle, a drone, a closed-circuit television (CCTV), a webcam for videotelephony, a virtual reality (VR) camera capable of capturing a 360-degree image, a camera for film and broadcast professionals, a VR and augmented reality (AR) camera, and the like.

As described above, the image sensor 1000 may obtain images captured at optically different zoom factors through a plurality of lens elements having different viewing angles. The image sensor 1000 may calculate a depth of an object in the captured images from different viewpoint information obtained from a multiarray lens in which the lens elements are arranged. The image sensor 1000 may calculate three-dimensional (3D) coordinate information of the object based on the calculated depth of the object. The image sensor 1000 may generate a synthesized image at a new viewpoint using the depth of the object and the viewpoint information. In addition, the image sensor 1000 may readjust a focus on the object using the depth of the object.

The units described herein may be implemented using hardware components and software components. For example, the hardware components may include microphones, amplifiers, band-pass filters, audio to digital convertors, non-transitory computer memory and processing devices. A processing device may be implemented using one or more general-purpose or special purpose computers, such as, for example, a processor, a controller and an arithmetic logic unit (ALU), a digital signal processor, a microcomputer, a field programmable gate array (FPGA), a programmable logic unit (PLU), a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums. The non-transitory computer readable recording medium may include any data storage device that can store data which can be thereafter read by a computer system or processing device.

Example embodiments include non-transitory computer-readable media including program instructions to implement various operations embodied by a computer. The media may also include, alone or in combination with the program instructions, data files, data structures, tables, and the like. The media and program instructions may be those specially designed and constructed for the purposes of example embodiments, or they may be of the kind well known and available to those having skill in the computer software arts. Examples of non-transitory computer-readable media include magnetic media such as hard disks, floppy disks, and magnetic tape; optical media such as CD ROM disks; magneto-optical media such as floptical disks; and hardware devices that are specially configured to store and perform program instructions, such as read-only memory devices (ROM) and random-access memory (RAM). Examples of program instructions include both machine code, such as produced by a compiler, and files containing higher level code that may be executed by the computer using an interpreter. The described hardware devices may be configured to act as one or more software modules in order to perform the operations of the above-described example embodiments, or vice versa.

The examples described herein are to be considered in a descriptive sense only, and not for purposes of limitation.

Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

While this disclosure includes specific examples, it will be apparent to one of ordinary skill in the art that various changes in form and details may be made in these examples without departing from the spirit and scope of the claims and their equivalents.

What is claimed is:

1. A mobile terminal comprising:
    a plurality of lens elements, each lens element of the plurality of lens elements including a plurality of scatterers arranged to concentrate light incident on a corresponding lens element;
    a sensing element configured to sense light passing through the plurality of lens elements; and
    a transparent substrate disposed between the plurality of lens elements and the sensing element, and configured to separate each lens element of the plurality of lens elements from the sensing element by a corresponding focal length of the lens element,
    wherein one lens element of the plurality of lens elements has a first focal length that is different from a second focal length of another lens element of the plurality of lens elements and is separated from the sensing element by the first focal length.

2. The mobile terminal of claim 1, further comprising:
    a sensing array comprising a plurality of sensing elements, including the sensing element, arranged in a form of an array, the sensing array having a plurality of sensing regions each configured to sense light passing through a respective lens element of the plurality of lens elements; and
    a processor configured to restore a scene image corresponding to a target zoom factor based on sensing information sensed from at least one sensing region of the plurality of sensing regions.

3. The mobile terminal of claim 2, wherein each lens element of the plurality of lens elements has a respective focal length that is different from respective focal lengths of other lens elements of the plurality of lens elements,
    wherein the processor is further configured to obtain a plurality of images,
    wherein each image of the plurality of images corresponds to a respective sensing region of the plurality of sensing regions, and
    wherein each image of the plurality of images corresponds to a respective viewing angle that is different from respective viewing angles of other images of the plurality of images.

4. The mobile terminal of claim 2, wherein the processor is further configured to, based on the target zoom factor being different from respective lens zoom factors of each lens element of the plurality of lens elements, restore the scene image corresponding to the target zoom factor from sensing information sensed from at least two sensing regions of the plurality of sensing regions.

5. The mobile terminal of claim 2, wherein the processor is further configured to, based on the target zoom factor being between a first lens zoom factor corresponding to a first lens element of the plurality of lens elements and a second lens zoom factor corresponding to a second lens element of the plurality of lens elements, restore the scene image corresponding to the target zoom factor from sensing information sensed from a first sensing region covered by the first lens element and a second sensing region covered by the second lens element.

6. The mobile terminal of claim 2, wherein the processor is further configured to, based on the target zoom factor corresponding to a lens zoom factor that corresponds to a lens element of the plurality of lens elements, restore the scene image corresponding to the target zoom factor from sensing information sensed from a sensing region covered by the lens element.

7. The mobile terminal of claim 2, wherein the processor is further configured to, based on the target zoom factor being input by a user, generate the scene image corresponding to the target zoom factor by detecting a common region in a plurality of images obtained from respective sensing regions of the plurality of sensing regions and synthesizing the obtained plurality of images based on the detected common region.

8. The mobile terminal of claim 1, wherein each scatterer of the plurality of scatterers is configured to delay a phase of light incident on the scatterer and change a path of the light.

9. The mobile terminal of claim 1, wherein each scatterer of the plurality of scatterers is disposed such that a shape of the scatterer, an arrangement of the plurality of scatterers, and a gap between adjacent scatterers of the plurality of scatterers is based on a focal length of a lens element including the scatterer among the plurality of lens elements.

10. The mobile terminal of claim 1, wherein the transparent substrate comprises a blocker configured to prevent light passing through a first lens element of the plurality of lens elements from being incident on a sensing region covered by a second lens element of the plurality of lens elements.

11. The mobile terminal of claim 10, wherein the blocker is disposed in at least a portion of an outer boundary of the sensing region.

12. The mobile terminal of claim 1, wherein the plurality of scatterers are disposed on one surface of the transparent substrate.

13. The mobile terminal of claim 12, wherein at least a portion of each scatterer of the plurality of scatterers protrudes outside the transparent substrate, and
    a remaining portion of each scatterer of the plurality of scatterers is formed inside the transparent substrate.

14. The mobile terminal of claim 1, wherein at least a portion of each scatterer of the plurality of scatterers and a remaining portion of each scatterer of the plurality of scatterers are disposed on opposite sides relative to a virtual surface parallel to a planar surface on which the sensing element is disposed.

15. The mobile terminal of claim 1, further comprising a plurality of additional lens elements disposed separately from the plurality of lens elements, the plurality of additional lens elements being configured to concentrate light incident on a corresponding additional lens element onto the plurality of lens elements.

16. An image sensing method to be performed by a mobile terminal, the image sensing method comprising:
    concentrating, by a plurality of lens elements, light incident on a corresponding lens element, each lens element of the plurality of lens elements including a plurality of scatterers; and
    sensing, by a sensing element, light passing through the plurality of lens elements, wherein one lens element of the plurality of lens elements has a first focal length that is different from a second focal length of another lens element of the plurality of lens elements and is separated from the sensing element by the first focal length, and wherein a transparent substrate is disposed between the plurality of lens elements and the sensing element, and each lens element of the plurality of lens elements is separated from the sensing element by a corresponding focal length of the lens element.

* * * * *